United States Patent
Choi

[11] Patent Number: 6,015,723
[45] Date of Patent: Jan. 18, 2000

[54] LEAD FRAME BONDING DISTRIBUTION METHODS

[75] Inventor: Chi-Young Choi, Seoul, Rep. of Korea

[73] Assignee: Samsung Electronics Co., Ltd., Rep. of Korea

[21] Appl. No.: 09/250,430

[22] Filed: Feb. 16, 1999

Related U.S. Application Data

[62] Division of application No. 08/696,399, Aug. 14, 1996, Pat. No. 5,898,225.

[30] Foreign Application Priority Data

Aug. 14, 1995 [KR] Rep. of Korea ............... 95-25004

[51] Int. Cl.[7] .................................................. H01L 21/44
[52] U.S. Cl. ........................ 438/123; 438/111; 438/121
[58] Field of Search ................... 438/111, 121, 438/122, 123

[56] References Cited

U.S. PATENT DOCUMENTS

| | | | |
|---|---|---|---|
| 3,698,082 | 10/1972 | Hyltin et al. ............... | 257/784 |
| 4,534,105 | 8/1985 | Reugch ....................... | 438/123 |
| 4,714,952 | 12/1987 | Takekawa et al. ........... | 257/676 |
| 4,891,687 | 1/1990 | Mallik et al. ............... | 257/676 |
| 4,937,656 | 6/1990 | Kohara ....................... | 257/676 |
| 5,012,323 | 4/1991 | Farnworth .................. | 257/676 |
| 5,235,207 | 8/1993 | Ohi et al. .................... | 257/670 |
| 5,237,202 | 8/1993 | Shimizu et al. ............. | 257/672 |
| 5,309,019 | 5/1994 | Moline et al. .............. | 257/670 |
| 5,365,409 | 11/1994 | Kwon et al. ................ | 361/813 |
| 5,386,141 | 1/1995 | Liang et al. ................ | 257/676 |
| 5,389,577 | 2/1995 | McClure ..................... | 438/118 |
| 5,442,228 | 8/1995 | Pham et al. ................ | 438/123 |
| 5,479,050 | 12/1995 | Pritchard et al. ........... | 257/670 |
| 5,576,577 | 11/1996 | Takenouchi et al. ........ | 257/672 |
| 5,598,031 | 1/1997 | Groover et al. ............. | 257/668 |
| 5,710,064 | 1/1998 | Song et al. .................. | 438/123 |
| 5,804,468 | 9/1998 | Tsuji et al. .................. | 438/123 |
| 5,897,340 | 4/1999 | Brooks et al. ............... | 438/121 |

FOREIGN PATENT DOCUMENTS

| | | |
|---|---|---|
| 0 214 307 | 3/1987 | European Pat. Off. . |
| 0 444 818 | 9/1991 | European Pat. Off. . |
| 39 42 843 | 6/1991 | Germany . |
| 5-226568 | 9/1993 | Japan . |
| 7-030067 | 1/1995 | Japan . |

OTHER PUBLICATIONS

European Search Report, Application No. EP 96 11 3017, Aug. 27, 1998.

*Primary Examiner*—Kevin M. Picardat
*Attorney, Agent, or Firm*—Myers Bigel Sibley & Sajovec

[57] ABSTRACT

An integrated circuit package includes an integrated circuit chip having first and second opposing faces and a plurality of pads on the first face of the integrated circuit chip. A plurality of external pins is also included along with a plurality of wires, a respective one of which electrically connects a respective external pin to a respective pad. A conductive lead frame is located adjacent and electrically contacting the second face of the integrated circuit chip. A first wire electrically connects a select one of the pads to the conductive lead frame. A second wire electrically connects a selected one of the pins to the conductive lead frame. Accordingly, power can be distributed to an integrated circuit package with reduced variation across the chip.

9 Claims, 3 Drawing Sheets

LEAD FRAME BONDING DISTRIBUTION METHODS

This application si a divisional of Ser. No. 08/696,399, filed Aug. 14, 1996, now U.S. Pat. No. 5,898,225.

FIELD OF THE INVENTION

This invention relates to integrated circuit packages and fabrication methods and more particularly to power distribution systems and methods for integrated circuit packages.

BACKGROUND OF THE INVENTION

Integrated circuit packages are widely used in consumer, commercial and military applications. With the current advances in the state of the art, higher density and higher speed integrated circuit packages are being produced. However, as the density and speed of integrated circuit packages continues to increase, it becomes more important to ensure the stability of power which is distributed throughout the integrated circuit and to reduce electrical noise which may be generated by the power distribution.

FIGS. 1A, 1B and 1C illustrate a conventional integrated circuit package 10. As shown, an integrated circuit chip 6 includes first (top) and second (bottom) opposing faces. A plurality of pads 4 are formed on the first face of the integrated circuit chip 6. A plurality of external pins 2 are provided. A plurality of wires 12 electrically connect a respective external pin 2 with a respective pad 4. A lead frame 8 is also included for mounting the integrated circuit chip 6 thereon.

As shown in FIGS. 1B and 1C, power is distributed within the chip 6 of a conventional integrated circuit package 10 by providing an electric current 14 from a power source 18 to the chip 6 and the lead frame body 8 through the bonding wire 12. Accordingly, the power transmitted to a block "a" within the integrated circuit 6 may be derived from the following equation:

$$Va = Vs - i \times (RL + RW + RS \times \text{square number}) < Vs$$

wherein Va represents the potential of the block a; Vs represents the voltage of the power source 18; i represents the electrical current 14; RL represents the resistance of the lead; RW represents the resistance of the bonding wire 12 and RS represents the resistance of a wafer substrate of the chip 6.

It will be understood that the resistance of the integrated circuit chip may reach several hundreds of ohms. Due to this resistance, a voltage drop may occur at point 16 on the chip. Accordingly, across the chip, internal voltage differences may occur. This may cause latch-up of the circuits on the chip or other improper operations. In order to avoid these problems, the density, speed or margins of the circuit may need to be relaxed. Moreover, the limitation on a number of power pads which are available on the chip may also create power supply voltage drop, latch-up or other noise problems.

SUMMARY OF THE INVENTION

It is therefore an object of the invention to provide improved integrated circuit packages and packaging methods.

It is another object of the present invention to provide integrated circuit packages and packaging methods which can supply power to an integrated circuit chip with reduced voltage variation across the chip.

These and other objects are provided, according to the present invention, by an integrated circuit package in which a conductive lead frame electrically contacts the second face of the integrated circuit chip and a first wire electrically connects a selected one of the external pins to the conductive lead frame to supply power or ground voltage to the chip. A second wire may also electrically connect a selected pad on the chip to the conductive lead frame. Improved power distribution and reduced noise susceptibility is thereby provided.

In particular, according to the invention, an integrated circuit package includes an integrated circuit chip having first and second opposing faces and a plurality of pads on the first face. A plurality of wires electrically connect a respective one a plurality of external pins to a respective pad. A conductive lead frame is located adjacent and electrically contacting the second face of the integrated circuit chip. A first wire electrically connects a second one of the pins to the conductive lead frame. A second wire electrically connects a selected one of the pads to the conductive lead frame.

When the integrated circuit chip has a p-type substrate (second face), the selected pin is a ground pin. Alternatively, when the integrated circuit chip has an n-type substrate (second face), the power supply voltage pin is used. Preferably, the selected pad is adjacent an edge of the integrated circuit, and remaining ones of the pads are spaced away from the edges of the integrated circuit. It will also be understood that a wire may be used to electrically connect a pad to the conductive lead frame, without requiring connection of an external pin to the conductive lead frame.

Methods of distributing power to an integrated circuit package according to the invention provide an additional pad on the first face of the integrated circuit chip at an edge thereof. A conductive lead frame is electrically connected to the second face of the integrated circuit chip. The additional pad is wire bonded to the conductive lead frame. A selected one of the pins may also be wire bonded to the conductive lead frame. Improved power or ground voltage distribution across the integrated circuit chip is provided so that noise margins may be improved and high speed, high density integrated circuit packages may be provided.

DETAILED DESCRIPTION OF PREFERRED EMBODIMENTS

Figure 1A:
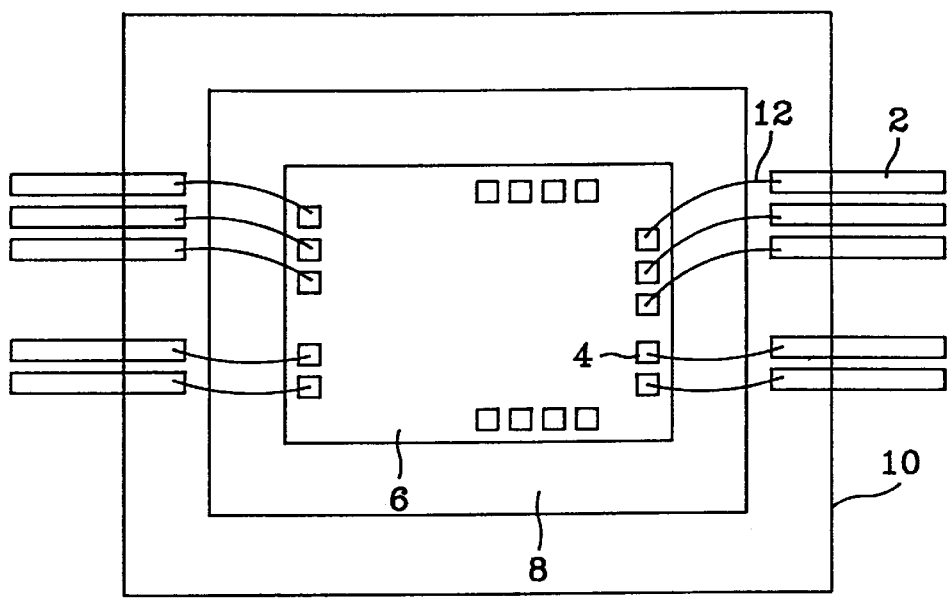
FIGS. 1A, 1B and 1C illustrate a conventional integrated circuit package.
Figure 1B:
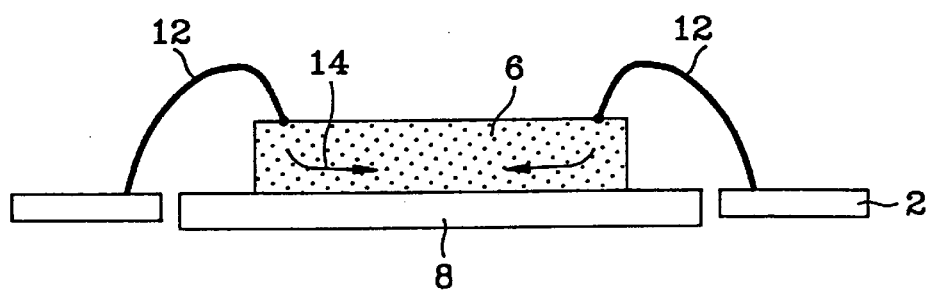
Figure 1C:
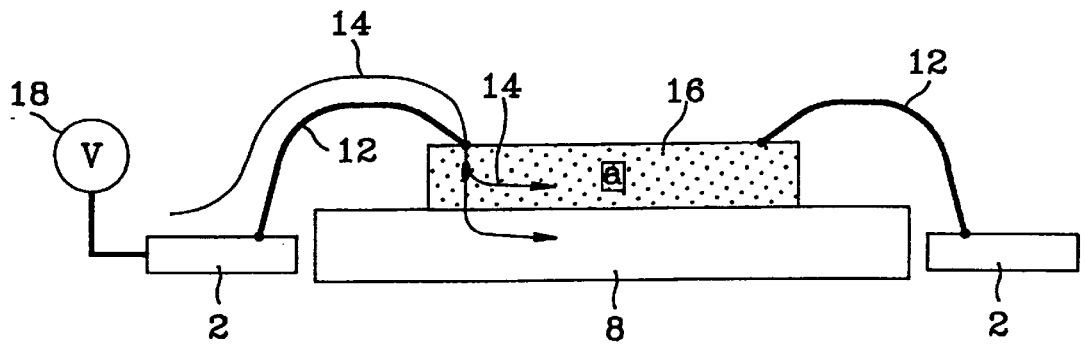

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
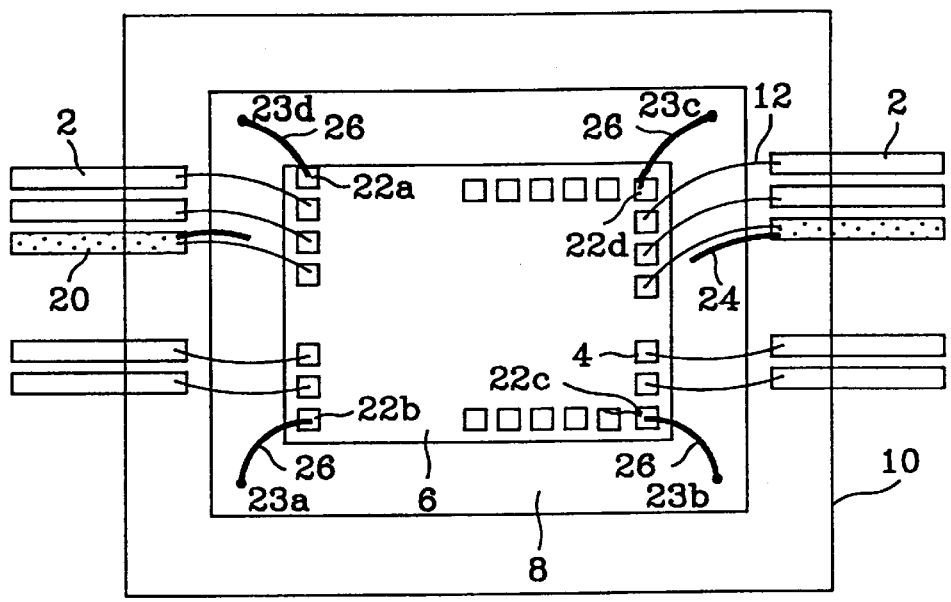
FIGS. 2A, 2B and 2C illustrate an embodiment of an integrated circuit package according to the present invention.
Figure 2B:
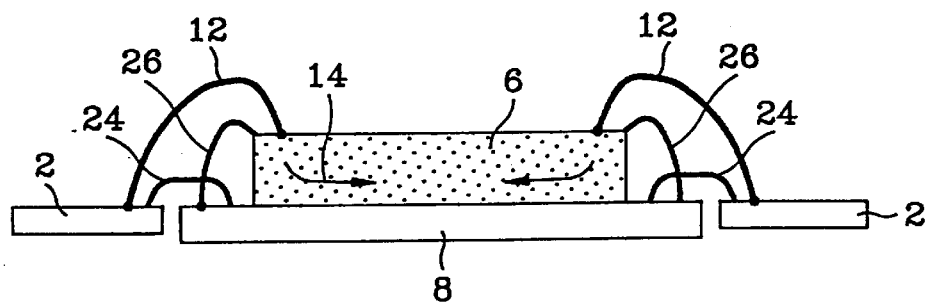
Figure 2C:
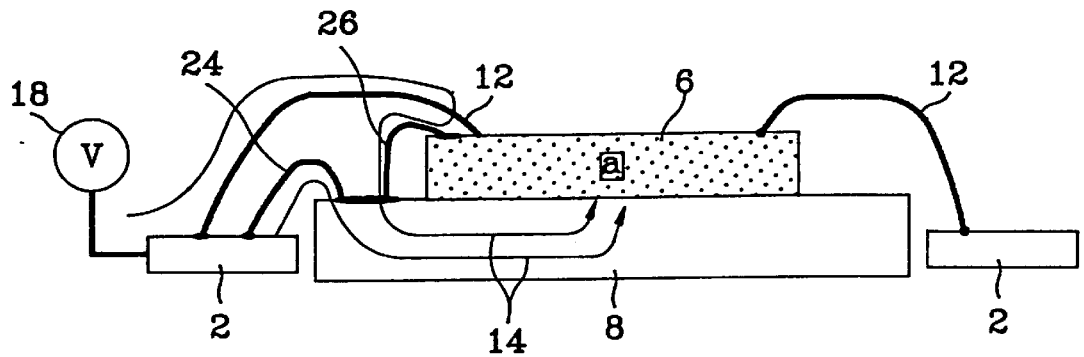

FIGS. 2A, 2B and 2C illustrate an integrated circuit package 10 and power distributing method according to the present invention. As shown in FIGS. 2A and 2B, conductive lead frame 8 is placed adjacent and electrically contacting the second face of the integrated circuit chip 6. A first wire 24 electrically connects one of the pins 2 to the lead frame 8. A plurality of additional pads, referred to herein as "dummy pads" 22a, 22b, 22c and 22d are electrically connected to the lead frame body at points 23d, 23a, 23b and 23c respectively, via bonding wires 26. As illustrated, at least one of the additional pads 22a is preferably formed adjacent the edges of the chip while the remaining pads are preferably formed interior to the chip, spaced away from the edges.

If the substrate of the chip, i.e. the substrate including the second face of the chip, is p-type, a ground potential pad and pin are electrically connected to the lead frame body. On the other hand, if the substrate including the second face is n-type, a power supply voltage pad and pin are connected to the lead frame body. As also shown in FIGS. 2A and 2B, the main pads 4 and pins 2 and 20 are electrically connected to each other using bonding wires 12.

FIG. 2C illustrates the distribution of power within the chip 6 by a package 10 according to the invention. As shown in FIG. 2C, current 14 from power source 18 is transmitted simultaneously to the chip 6 and to the lead frame body 8 through the bonding wire 12, through the wire 26 which bonds the dummy pads 22a–22d to the lead frame 8 and through the wire 24 which bonds the power pad 20 and the lead frame body 8. Power which is distributed to block "a" in the integrated circuit chip 6 can be derived from the following equation:

$$Va = Vs - i \times (RL + RW + Rf) \cong Va$$

wherein Rf represents the resistance of the lead frame body. As shown, since a large voltage drop does not occur in the current flowing into the lead frame body, power can be stably and vertically provided within the chip.

Figure 3A:
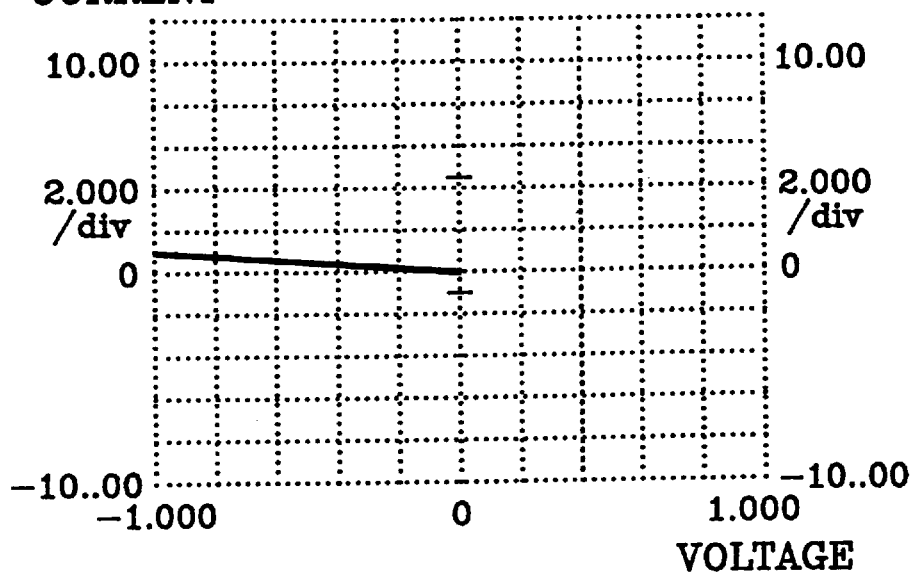
FIGS. 3A and 3B graphically illustrate current and voltage distribution in integrated circuit packages.
Figure 3B:
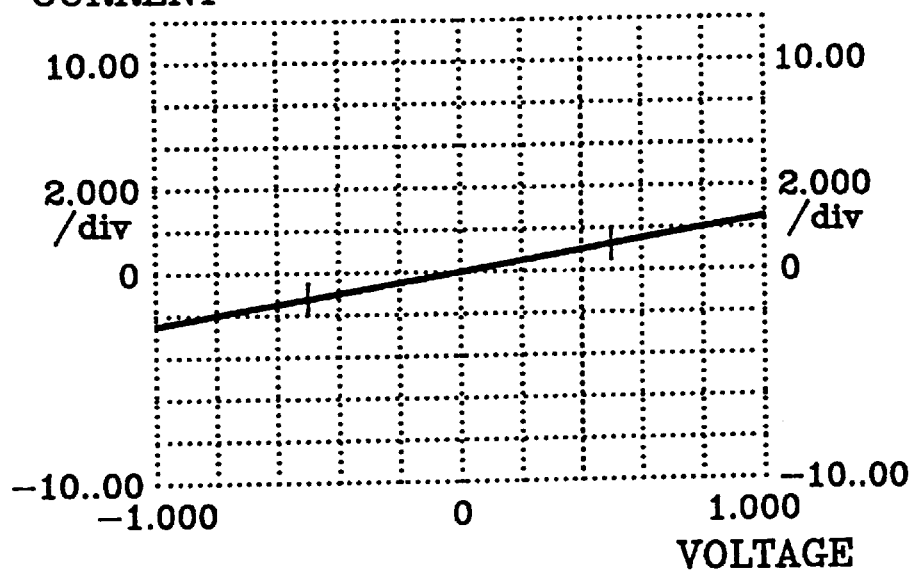

FIGS. 3A and 3B illustrate the difference between the resistance of an integrated circuit chip substrate having a size of one cm, and the resistance which occurs upon bonding the lead frame body in accordance with the present invention. As shown in FIGS. 3A and 3B, the resistance for an n-type substrate is about 350 ohms and the resistance of the bonding to the lead frame body is about 5 ohms or less. Accordingly, in prior art integrated circuit packages, the supply voltage substantially changes depending upon the current during the operation of the package. However, in an integrated circuit package according to the invention, more stable operation is provided notwithstanding current variation in the device because of the lower resistance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of distributing power to an integrated circuit package including an integrated circuit chip having first and second opposing faces, a plurality of pads on the first face of the integrated circuit chip, a plurality of external pins, and a plurality of wires, a respective one of which directly electrically connects a respective external pin to a respective pad, said method comprising the steps of:

electrically contacting a conductive lead frame to the second face of the integrated circuit chip; and bonding a selected one of the external pins which is connected to a selected one of the wires to the conductive lead frame to thereby electrically connect the second face of the integrated circuit chip to the selected one of the external pins via the conductive lead frame.

2. A method according to claim 1 further comprising the step of:

wire bonding a selected one of the pads to the conductive lead frame.

3. A method according to claim 1 wherein the selected one of the pins is a ground pin and wherein the second face of the integrated circuit chip is a p-type second face.

4. A method according to claim 1 wherein the selected one of the pins is a power supply voltage pin and wherein the second face of said integrated circuit chip is an n-type second face.

5. A method according to claim 1 wherein the selected one of the pads is adjacent an edge of the integrated circuit chip, and wherein remaining ones of said plurality of pads are spaced away from edges of the integrated circuit chip.

6. A method of distributing power to an integrated circuit package including an integrated circuit chip having first and second opposing faces, a plurality of pads on the first face of the integrated circuit chip that are spaced-apart from the edges thereof, a plurality of external pins, and a plurality of wires, a respective one of which directly electrically connects a respective external pin to a respective pad, said method comprising the steps of:

providing an additional pad on the first face of the integrated circuit chip, at an edge thereof;

electrically contacting a conductive lead frame to the second face of the integrated circuit chip; and bonding the additional pad to the conductive lead frame.

7. A method according to claim 6 further comprising the step of:

wire bonding a selected one of the pins to the conductive lead frame.

8. A method according to claim 6 wherein the additional pad is a ground pad and wherein the second face of the integrated circuit chip is a p-type second face.

9. A method according to claim 6 wherein the additional pad is a power supply voltage pad and wherein the second face of said integrated circuit chip is an n-type second face.

* * * * *